United States Patent [19]

Epstein

[11] 4,314,383

[45] Feb. 9, 1982

[54] AUTOMOBILE FUSE PULLER AND COMBINATION CIRCUIT TESTER

[75] Inventor: Harry Epstein, Seaford, N.Y.

[73] Assignee: Kastar, Inc., Bellrose, N.Y.

[21] Appl. No.: 123,928

[22] Filed: Feb. 25, 1980

[51] Int. Cl.³ .......................... B25F 1/00; B25B 27/14; G01R 19/16

[52] U.S. Cl. .......................................... 7/170; 294/115; 81/3.8; 269/6; 324/133; D10/78

[58] Field of Search ....................... 81/3.8, 454; 7/170, 7/107, 165; 294/19 R, 106, 115, 116, 117; D10/75, 77, 78, 79; 324/133; 269/6

[56] References Cited

U.S. PATENT DOCUMENTS

| | | | |
|---|---|---|---|
| 207,620 | 9/1878 | Parmelee | 269/6 |
| 1,141,742 | 6/1915 | Wiseman | 294/116 |
| 1,156,764 | 10/1915 | Druck | 269/6 |
| 1,421,152 | 6/1922 | Berman | 294/116 |
| 1,491,726 | 4/1924 | Nelson | 81/3.8 |
| 1,927,528 | 9/1933 | Nilsson | 81/3.8 |
| 2,023,916 | 12/1935 | Dante | 81/3.8 |
| 2,438,797 | 3/1948 | Bagge | 269/6 |
| 2,763,834 | 9/1956 | Macdonald | 339/32 R |

FOREIGN PATENT DOCUMENTS

| | | | |
|---|---|---|---|
| 927972 | 6/1963 | United Kingdom | 7/165 |

*Primary Examiner*—Roscoe V. Parker
*Attorney, Agent, or Firm*—Lackenbach, Siegel, Marzullo, Presta & Aronson

[57] ABSTRACT

An improved fuse removing apparatus including an elongated housing, a pair of complementary jaws extending generally longitudinally outwardly from the housing for engagement with a fuse. The complementary jaws are secured within the housing in longitudinal sliding relationship such that a plate at the end of the housing forces the jaws towards each other when the complementary jaws are urged into the housing. A cap disposed over the plate causes the jaws to rotate during use so as to lockingly engage the plate and thereby firmly grip a fuse without having to manually rotate the housing. All that is necessary to lock the device onto the fuse is to simply push the apparatus onto the exposed part of a fuse. A minimum of manual rotation is all that is required to disengage the jaws from the locking plate, and thereby release the retained fuse.

7 Claims, 9 Drawing Figures

AUTOMOBILE FUSE PULLER AND COMBINATION CIRCUIT TESTER

BACKGROUND OF THE INVENTION FIELD OF THE INVENTION

The invention relates to fuse pullers, and more particularly to an improved fuse puller requiring a minimum of manual manipulation, in combination with an electrical fuse and circuit tester. The invention is particularly directed towards removing and replacing fuses in connection with automobiles, ATC type fuses, which are disposed in relatively inaccessible locations. The present invention therefore provides for an improved fuse pulling and fuse testing apparatus especially adapted for automobile usage.

DESCRIPTION OF THE PRIOR ART

Various attempts have been made in the past to produce fuse pulling apparatus and such in combination with circuit testing means which usually include complementary jaws which are brought together by either squeezing the handles of a scissors like device or by the use of elaborate and complicated mechanisms to pull the jaws together. Conventional fuse pullers require a great deal of manual manipulation in order to work the mechanism required to move the jaws towards one another. As those skilled in the art will appreciate, heretofore there have been no developments which greatly reduce the amount of manipulation required to cause the jaws to engage a fuse.

There exists prior art U.S. patents which disclose fuse pullers, and fuse pullers in combination with electrical testing devices. However, none of the prior art patents teach or suggest in any manner, either singly or in combination, the structure disclosed herein.

The prior art patents known to Applicant are as follows:

| | |
|---|---|
| MAC DONALD | 2,763,834 |
| DANTE | 2,023,916 |
| NILSSON | 1,927,528 |
| NELSON | 1,491,726 |

DANTE discloses a combination fuse pulling pliers and testing means, but utilizes a scissors type action in order to have the jaws engage the fuse. Such device requires a great deal of manual manipulation, and a great deal of room in order to be operated.

NELSON provides jaws which are secured within a threaded shank. The body of the fuse pliers must be rotated many times in order for the jaws to be squeezed closer together until they are in a position to encircle and grasp a fuse. Such device requires a great deal of time and movement in order to cause the jaws to move towards one another.

NILSSON shows a pair of pivoted jaws which are secured to a slide which is moved longitudinally in order to cause the jaws to open and close. This prior art apparatus has the disadvantage of requiring elaborate means to rotate the jaws which are at an extremely poor mechanical disadvantage to the ends of the jaws engaging the fuse.

MAC DONALD shows a conventional fuse tester including a probe which extends outwardly of one end of the device. This prior art patent does not, however, suggest how such could be combined with a fuse pliers.

SUMMARY OF THE INVENTION

The present invention overcomes important disadvantages of the prior art fuse pulling and testing apparatus by providing an elongated easily held casing which may be caused to lockingly engage a fuse without any manual rotation of the device. The present invention provides means for slightly rotating the jaws of the fuse pulling apparatus causing them to lockingly engage a fuse thereby eliminating the need to manually rotate the device during use. The present invention includes a housing in which is partially disposed a pair of complementary jaws which are adapted to longitudinally slide within the housing. The jaws extend outwardly of the operative end of the housing and are urged toward one another when the jaws are moved inwardly, and simultaneously urged to slightly rotate and lock to prevent longitudinal movement with respect to said housing when said jaws are in their innermost position. It is an easy matter to dispose the jaws about a fuse held within a fuse panel, cause the jaws to slide inwardly into the housing thereby locking onto the fuse to facilitate removal utilizing the device. Thereafter, the fuse may be disengaged from the jaws of the device by slightly rotating the jaws in the direction opposite causing locking, whereupon the jaws are urged outwardly and apart by the action of a spring, or the like, and the device is then ready for further use. The end opposite the operative end of the apparatus could contain further jaws, and associated mechanism, whereby the jaws are shaped to engage a different type or size of fuse; or an electrical probe may be provided which is electrically in connection with a test lamp which is in turn electrically connected to a lead wire adapting the apparatus for use in connection with circuit testing.

These, together with the various ancillary objects and features of the present invention, which will become apparent as the following description proceeds, are obtained by the automobile fuse tester and combination fuse puller, preferred embodiments of which are shown in the accompanying drawing by way of example only, wherein:

DETAILED DESCRIPTION OF THE INVENTION

Figure 3:
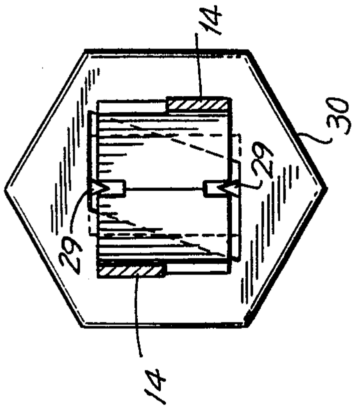
FIG. 3, is a vertical sectional view taken along the plane of line 3—3 in FIG. 2.

With reference to the accompanying drawing, wherein like reference numerals throughout the various views designated similar parts, reference number 10 is used generally to designate a fuse testing mechanism in accordance with the present invention. The body or housing 12 of the fuse puller is an elongated cylinder, with an outer cross-sectional shape resembling that of a hexagon. Such shape facilitates easy manual handling, but it is within the scope of the present invention that the elongated housing 12 may be of any exterior shape, and the housing 12 may be made of any substantially rigid material, such as plastic or metal, or the like, but preferrable the housing 12 is of an insulating material such as an engineering rigid plastic.

Figure 2:
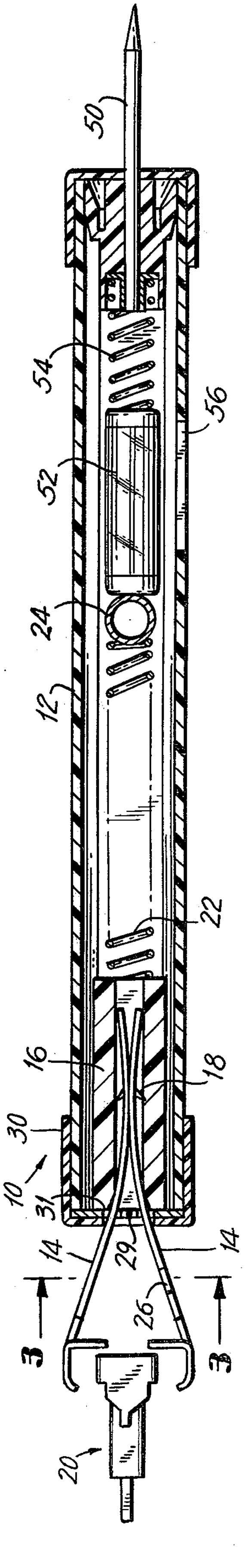
FIG. 2, is a vertical sectional view taken along the plane of line 2—2 in FIG. 1.

With reference to FIG. 2, partially disposed within the housing 12, at the left end of the housing, hereinafter referred to as the operative end, are a pair of complementary jaws 14 which are mounted to slide within the housing 12 in a casing 16. The jaws 14 may be affixed in the casing 16, or retained therein and held against outward removal by the use of a barb of the like such as shown at 18. As one skilled in the art must appreciate, the jaws 14 may be simply glued within the casing 16 or affixed therein by conventional means.

The jaws 14 are preferably made of a spring steel such that they are flexible, and are formed at their outermost end to engage, in complementary fashion, a fuse such as the ATC type fuse depicted at 20. The ends of the jaws 14 may be shaped to engage any particular type of fuse, such as, for example, the ends could be semi-circular in shape to engage a barrel type cylindrically shaped fuse, or the jaws could be modified to the particular configuration of any desired work piece.

The casing 16 is urged toward the operative end of the device by the use of a coil spring, or the like, which at one end abuts the casing 16, and at its other end, the stationary end, engages a rivet or grommet 24 which is firmly affixed to the casing 12 and provides a stationary support for the coil spring 22.

Figure 4:
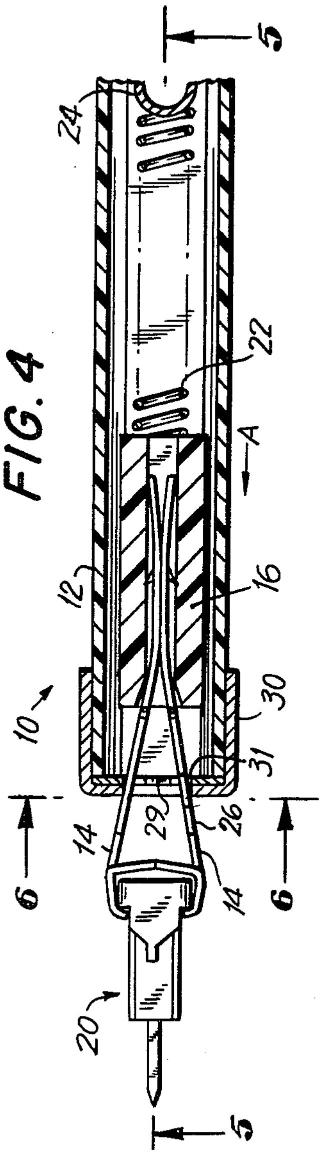
FIG. 4, is a partial vertical sectional view similar to that shown in FIG. 2, showing the jaws engaging a fuse and locked to prevent longitudinal movement.

As the jaws 14 are urged outwardly, and due to their outwardly diverging shape, the jaws tend to separate to facilitate engaging the end of a fuse such as that shown at 20. With reference to FIG. 4, if the fuse 20 were maintained stationary such as when disposed within a fuse block and the device were moved towards the fuse, in the direction of arrow A in FIG. 4, after the jaws 14 engaged the exposed end of the fuse 20 the jaws would be urged to move inwardly against the action of coil spring 22 until the notches 26 formed in each jaw come into alignment with the retaining plate 28. Plate 28 is located just behind the retaining cap 30 which serves to hold the retaining plate in place. The retaining plate has a substantially rectangular shaped opening therein through which the jaws 14 are disposed. When notches 26 are placed into alignment therewith slight rotation of the jaws urging the notches towards the edge of the retaining plate will cause the notches to slide over the inner edge thereof whereby the outwardly urging of the coil spring 22 will serve to lock the jaws into place so that further longitudinal movement is prevented.

Figure 5:
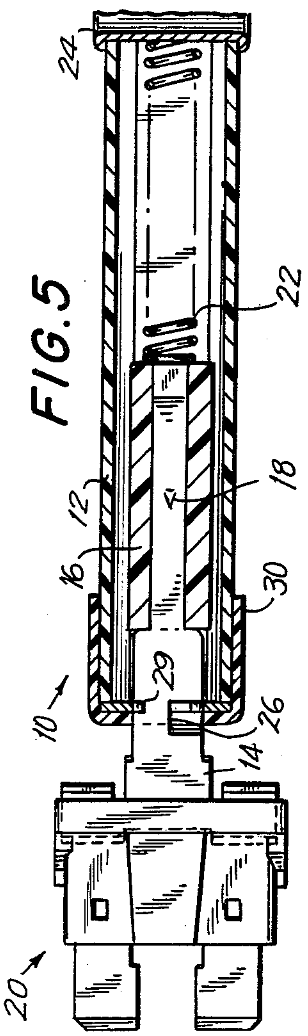
FIG. 5, is a vertical sectional view taken along the plane of line 5—5 in FIG. 4.

FIG. 5 depicts the jaws in a locked position after they have been caused to rotate slightly.

Figure 6:
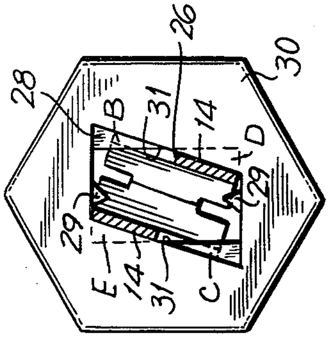
FIG. 6, is a vertical sectional view taken along the plane of line 6—6 in FIG. 4.
Figure 9:
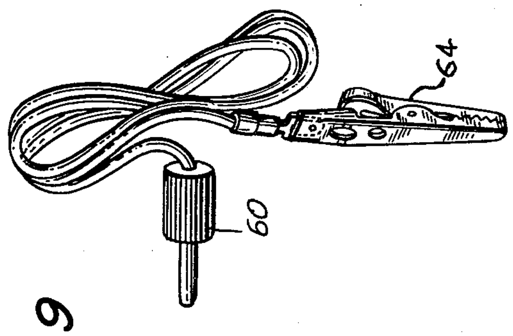
FIG. 9, shows a spade terminal which may be connected to the fuse tester.
Figure 8:
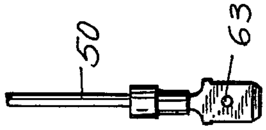
FIG. 8, shows a spade terminal disposed on the probe end of the circuit tester.

FIG. 6 depicts the jaws in their locked position wherein the notches are engaging the interior edge of the retaining plate 28. The inner edge of notch 26 which can be readily seen in FIG. 1 rests upon the inner surface of retaining plate 28 to resist the outward urging of spring 22. The outer surface of retaining plate 28 is partially covered by the cap 30, but the width of notch 26 may be great enough so that not portions of the outer surface of the retaining plate need be exposed. The plate as seen in FIG. 6, may have one or more pointed portions 29 which extend into the opening and form a rigid barrier keeping the jaws from rotating beyond a predetermined degree when they are in their outermost extended position.

In a preferred embodiment the outer surface of the retaining plate 28 is exposed at two locations B and C which correspond to the general area where the notches 26 and the jaws 14 engage the retaining plate 28 when rotated in the closed position. The opening formed in the cap 30 is substantially trapezoidal in shape and extends over into the opening beyond the retaining plate 28 at locations D and E. Such an end configuration allows the notches 26 to be wide enough only to fit over the retaining plate 28, thereby necessitating notches of a width only slightly greater than the thickness of plate 28. The portions of cap 30 D and E which extend into the opening are of a resiliant material to urge the jaws while being closed to rotate clockwise thereby causing the notches to move into engagement with the retaining plate 28. As will be readily understood by one skilled in the art, it is possible to simply thrust the casing towards a fuse in order to have the jaws close therearound, whereby continuing the movement will cause portions D and E of the cap to rotate the jaws forcing the notches 28 to lock onto the retaining plate when brought into adjacent positions. It is therefore possible to lock the device onto a fuse without manual rotation of the handle or casing.

Once the device is locked, the fuse may be pulled from its location by pulling on the handle, causing the jaws to pull on the bearing plate 28 which engagement at portions 27. Such arrangement enables the fuse to be pulled with the jaws in the locked position.

Simply rotating the jaws with the fuse therein in the direction opposite that required to lock the jaws, will bring the notches 26 out of engagement with the retaining plate 28. The action of spring 22 will cause the jaws to move outwardly of the handle and release the fuse.

Those skilled in the art will appreciate that in present day automobiles, the fuses are located in a difficult location to service, up under the dashboard close to the fire wall of the automobile, whereby it is extremely difficult to utilize conventional fuse pullers or tools in order to remove fuses which are disposed in the fuse box. Accordingly, mechanics often assume uncomfortable and contorted positions in order to reach the fuse box and a minimum of manual manipulation facilitates fuse removal. Therefore, with the present invention it is only required to place the jaws on to the end of a fuse and push whereby the jaws self-lock and simply pulling the device enables one to urge the fuse outwardly. No manual manipulation or rotation beyond such is required with the present invention to remove a fuse.

Figure 1:
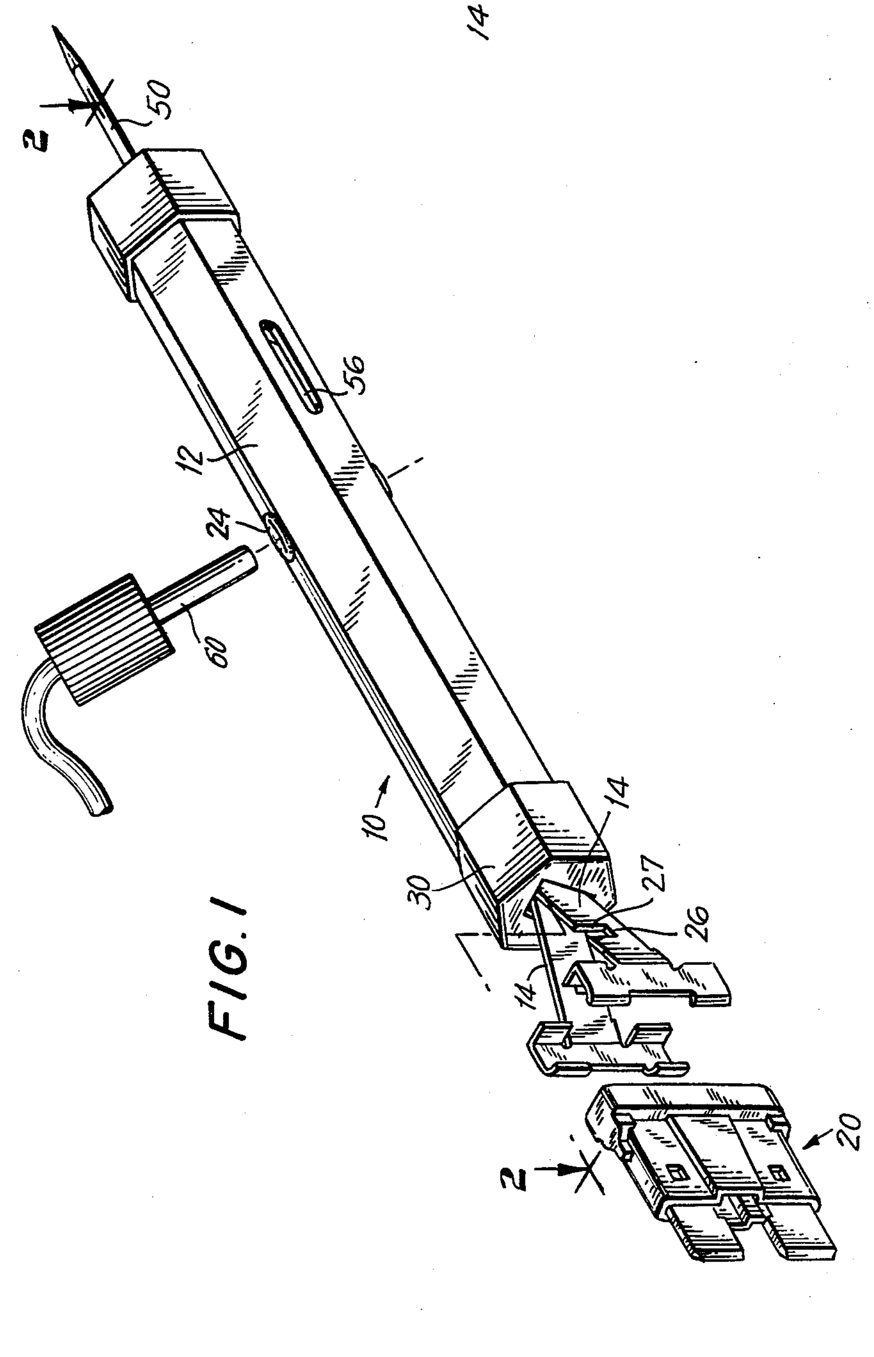
FIG. 1, is a perspective view of the improved fuse removing apparatus showing an ATC type fuse at the jaw end.

As it is often desired to test a circuit in order to ascertain if a fuse is faulty, the present invention may be adapted to function as a combined fuse puller and circuit tester by the provision of an electrically conductive probe 50 which is placed into electrical connection with a test lamp 52 such as a festoon type lamp or a subminiature incandesent bulb. The electrical connection may be by way of a spring 54 or the like, or other suitable electrically conductive wire, or the ends of the festoon bulb may simply engage the end of the electrically conductive probe 50. Test lamp 52 is then electrically connected to the rivet 24 which when functioning as part of a circuit tester is of an electrically conductive material. The rivet 24 then acts as an electrical receptical for the plug 60, and is hollow to accommodate such as shown in FIG. 1. The electrical connection between the test lamp 52 and rivet 24 being by way of engagement of the festoon bulb therewith or by suitable spring or wires. An opening 56 would be provided in the housing in order to allow the user to see when the bulb is illuminated.

Figure 7:
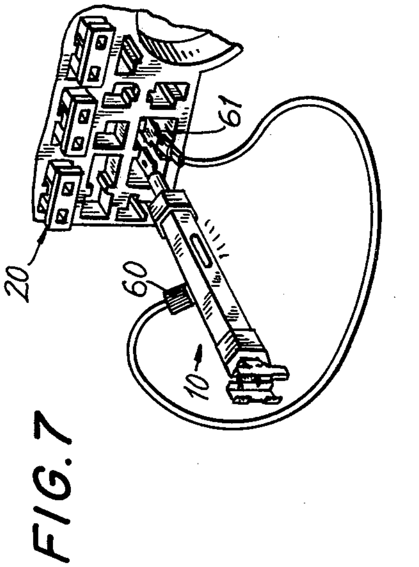
FIG. 7, is a perspective view showing utilizing the circuit tester portion of the device in connection with a fuse block.

As shown in FIG. 1, a suitable plug 60 may be electrically connected into the interior portion of the grommet, or other electrical connection made so that a circuit may be tested between the end of electrical probe 50 and the working end of the electrical wire extending from plug 60. The working end may be fitted with a spade terminal, or the like such as shown in FIG. 7 which adapts the free end of the wire to engage the receptacle used with ATC type fuses, or a suitable spade terminal may be provided 63 and may be fitted over the end of probe 50. An alligator clip 64 may be provided which has an end shaped to fit over a spade terminal thereby adapting the plug portion of the testing circuit to fasten on to exposed metal portions.

The circuit testing portion of the fuse puller is thereby adapted for a multitude of arrangements whereby the probe may be utilized with its pointed end to engage exposed portions of an electrical circuit or an ATC type fuse, or may be used in connection with a spade terminal whereby the working may be utilized with a spade terminal or alligator clip, or the like.

It must be appreciated that it is within the scope of the present invention to have a fuse pulling mechanism at both ends of the housing 12, eliminating the fuse testing portion, whereby two differently sized or shaped complimentary jaws may be provided. The rivet 24 would serve as a biasing means for the spring means 22 for both mechanisms whereby both of these mechanisms could be operated independently of one another.

A latitude of modification, substitution and change is intended in the foregoing disclosure, and is some instances, some features of the present invention may be employed without a corresponding use of other features.

I claim:

1. An improved fuse pulling apparatus comprising an elongated housing, a pair of complementary jaws slidably mounted within said housing and extending partially outwardly thereof, means for urging the jaws towards one another as the jaws are moved into the housing, means for urging the jaws to rotate as the jaws are moved into the housing, and means for locking the jaws in a closed position such that forward movement without manual rotation of the device would cause the jaws to lock onto a fuse, said means for urging the jaws toward one another includes a plate having a substantially rectangular opening through which said pair of complementary jaws are disposed, said means for urging the jaws to rotate include a cap disposed over said plate having an aperture through which said complementary jaws are disposed, and portions which extend inwardly of the opening in said plate, and said means for locking the jaws in a closed position includes at least one notch in each said jaw of a thickness slightly greater than that of said plate whereby each of said jaws may be disposed onto the edge of said plate when said notches are brought into adjacent position therewith.

2. An apparatus as claimed in claim 1, further including a spring mounted within said housing urging said jaws outwardly of the housing.

3. An apparatus as claimed in claim 2, further including a rivet disposed through said housing to bias said spring against said movement relative to said housing.

4. An apparatus as claimed in claim 3, further including an alectrical probe electrically connected to an electrical lamp which is in electrical contact with said rivet such that the device may function as a circuit tester in combination with the fuse pulling apparatus.

5. An apparatus as claimed in claim 4, further including the electrical plug adapted to fittingly engage said rivet being of an electrically conductive material, and an electrical wire extending from said electrical plug having a spade terminal at the end thereof.

6. An apparatus as claimed in claim 5, wherein said electrical lamp is a festoon type bulb.

7. An apparatus as claimed in claim 6, wherein said housing has an opening adjacent said bulb to allow external viewing thereof.

* * * * *

UNITED STATES PATENT AND TRADEMARK OFFICE
CERTIFICATE OF CORRECTION

PATENT NO. : 4,314,383

DATED : February 9, 1982

INVENTOR(S) : Harry Epstein

It is certified that error appears in the above—identified patent and that said Letters Patent is hereby corrected as shown below:

On the Title Page, Item [73] "Bellrose" should read --- Bellport ---.

Signed and Sealed this

*First* Day of *June 1982*

[SEAL]

*Attest:*

GERALD J. MOSSINGHOFF

*Attesting Officer* — *Commissioner of Patents and Trademarks*